(12) United States Patent
Iriguchi

(10) Patent No.: US 6,707,126 B2
(45) Date of Patent: Mar. 16, 2004

(54) SEMICONDUCTOR DEVICE INCLUDING A PIN PHOTODIODE INTEGRATED WITH A MOS TRANSISTOR

(75) Inventor: Chiharu Iriguchi, Sawa (JP)

(73) Assignee: Seiko Epson Corporation (JP)

( * ) Notice: Subject to any disclaimer, the term of this patent is extended or adjusted under 35 U.S.C. 154(b) by 118 days.

(21) Appl. No.: 09/993,928

(22) Filed: Nov. 14, 2001

(65) Prior Publication Data

US 2002/0081766 A1 Jun. 27, 2002

(30) Foreign Application Priority Data

Nov. 15, 2000 (JP) .................................... 2000-348502

(51) Int. Cl.[7] ............................................ H01L 31/075
(52) U.S. Cl. ...................... 257/458; 257/428; 257/431
(58) Field of Search ................................ 257/458, 428, 257/462, 431, 461, 414

(56) References Cited

U.S. PATENT DOCUMENTS 6,111,305 A * 8/2000 Yoshida et al. ............. 257/656
2003/0025138 A1 * 2/2003 Clevenger et al. .......... 257/292

* cited by examiner

*Primary Examiner*—Richard Elms
*Assistant Examiner*—Brad Smith
(74) *Attorney, Agent, or Firm*—Harness, Dickey & Pierce, P.L.C.

(57) ABSTRACT

A semiconductor device is provided which has high sensitivity and excellent electrical power saving due to a structure in which an element having a pin photodiode and a MOS transistor which are integrated is formed in an SOI substrate or the like. A production method and an electronic device are also provided.

8 Claims, 7 Drawing Sheets

[FIG. 1]
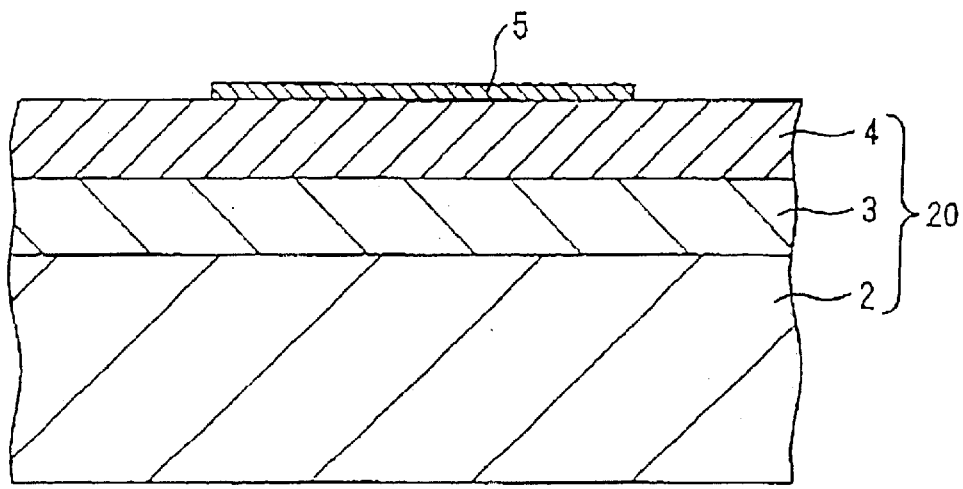
[FIG. 2]
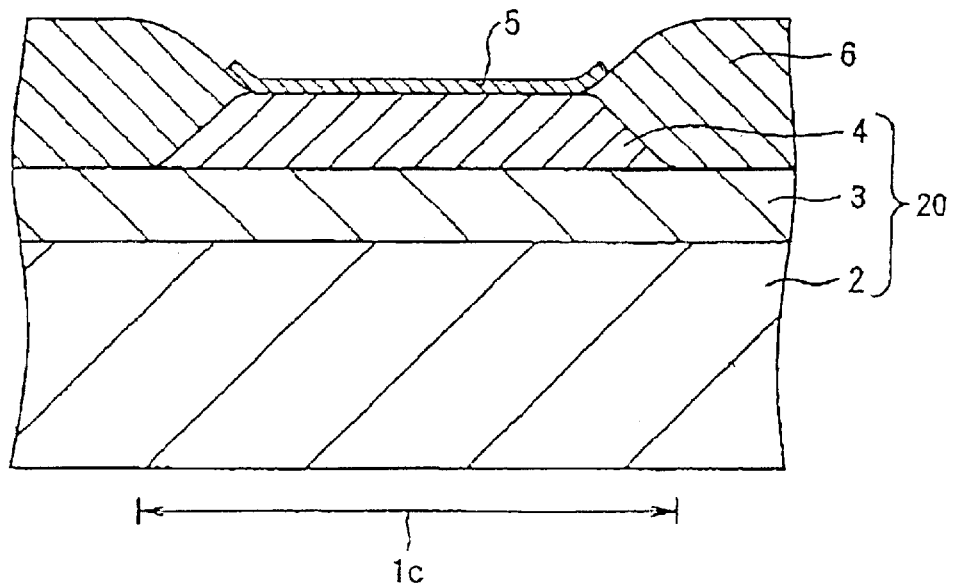

[FIG. 3]
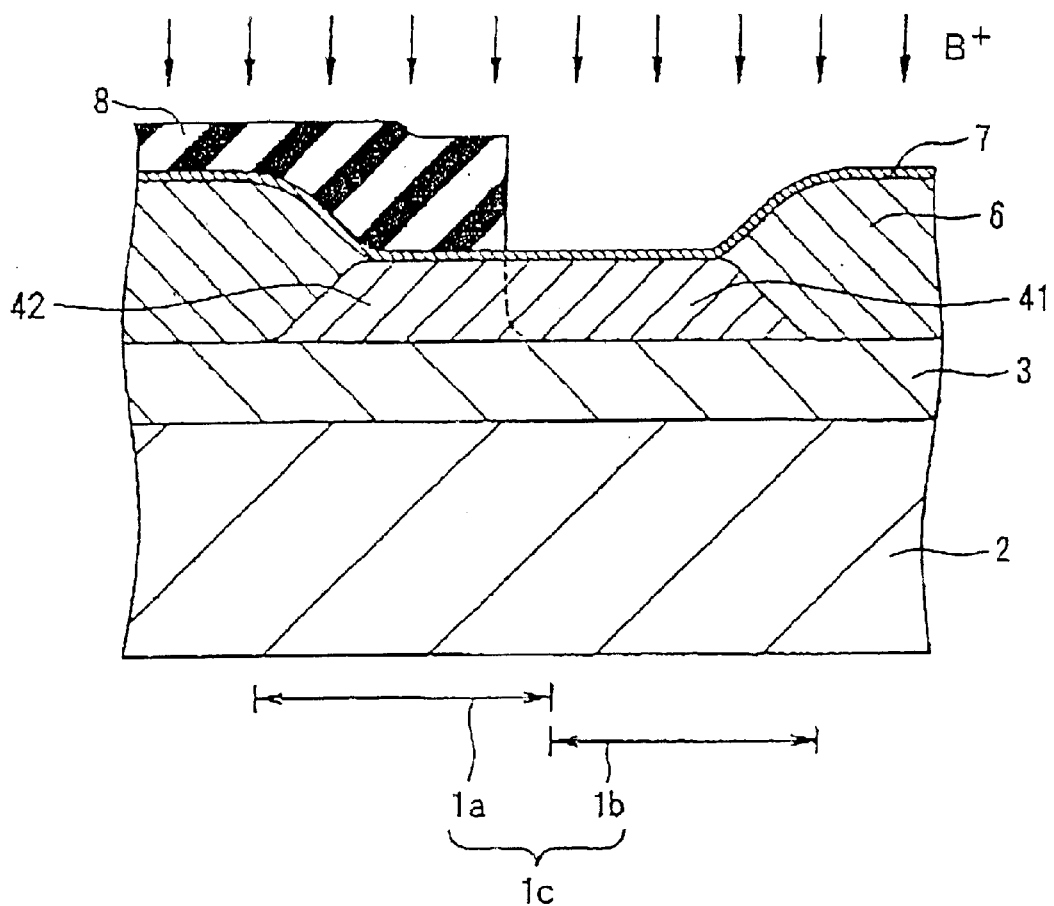

[FIG. 4]
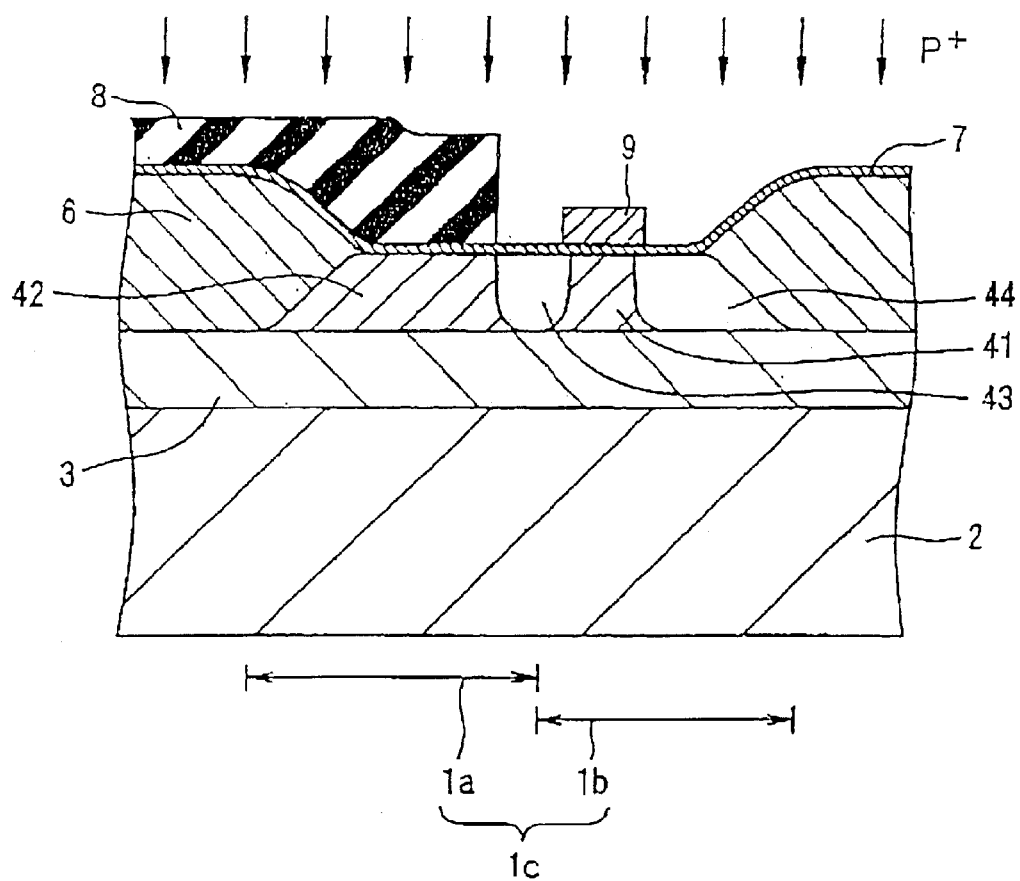

[FIG. 5]
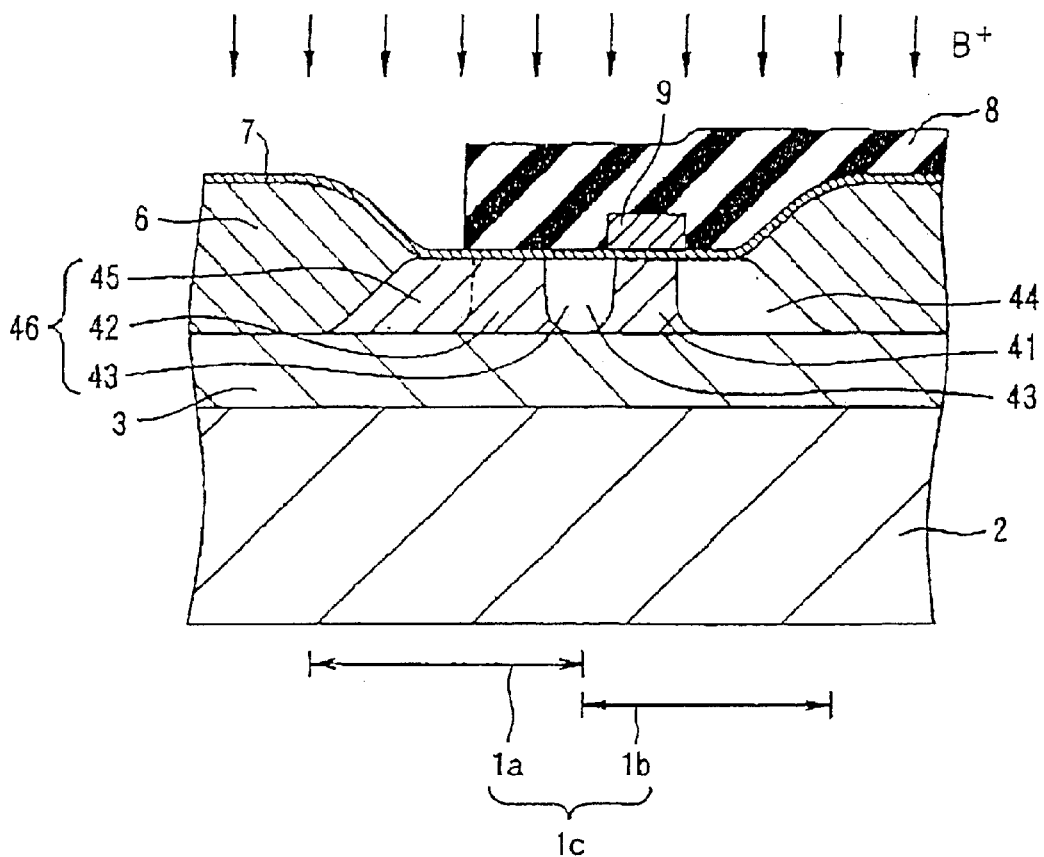

[FIG. 6]
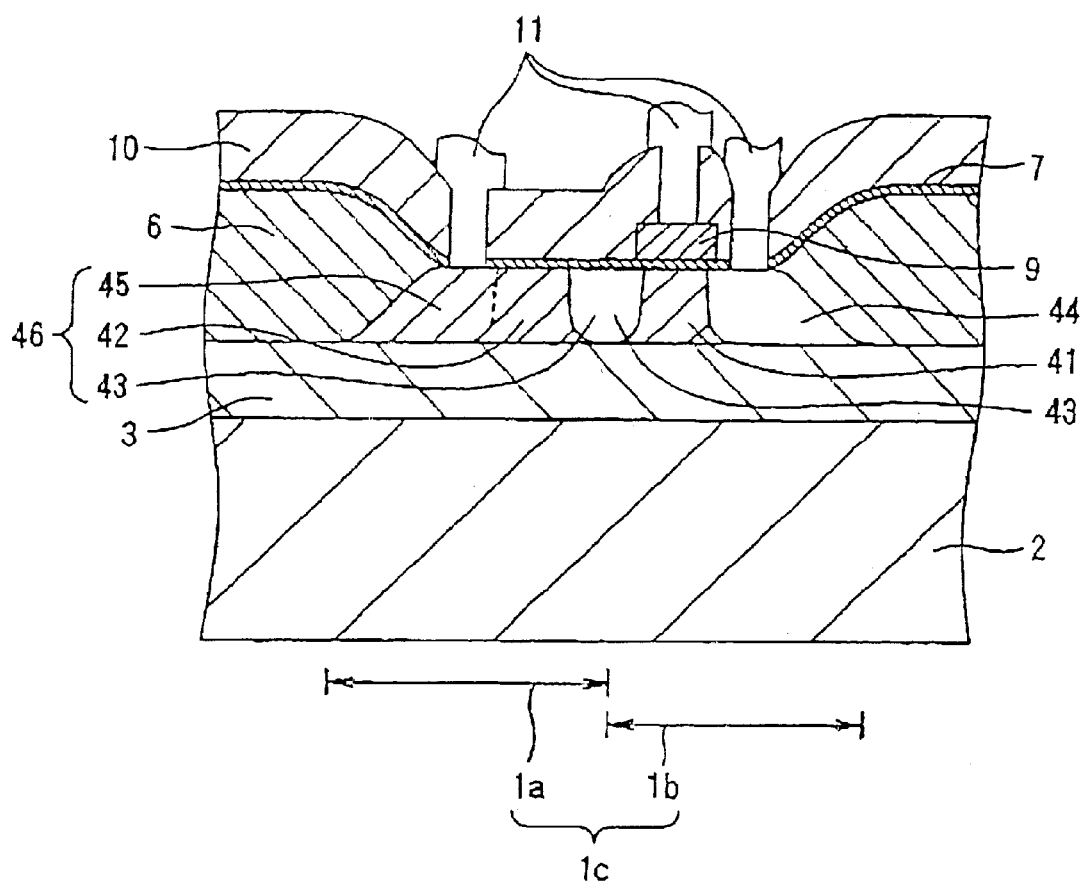

[FIG. 7]
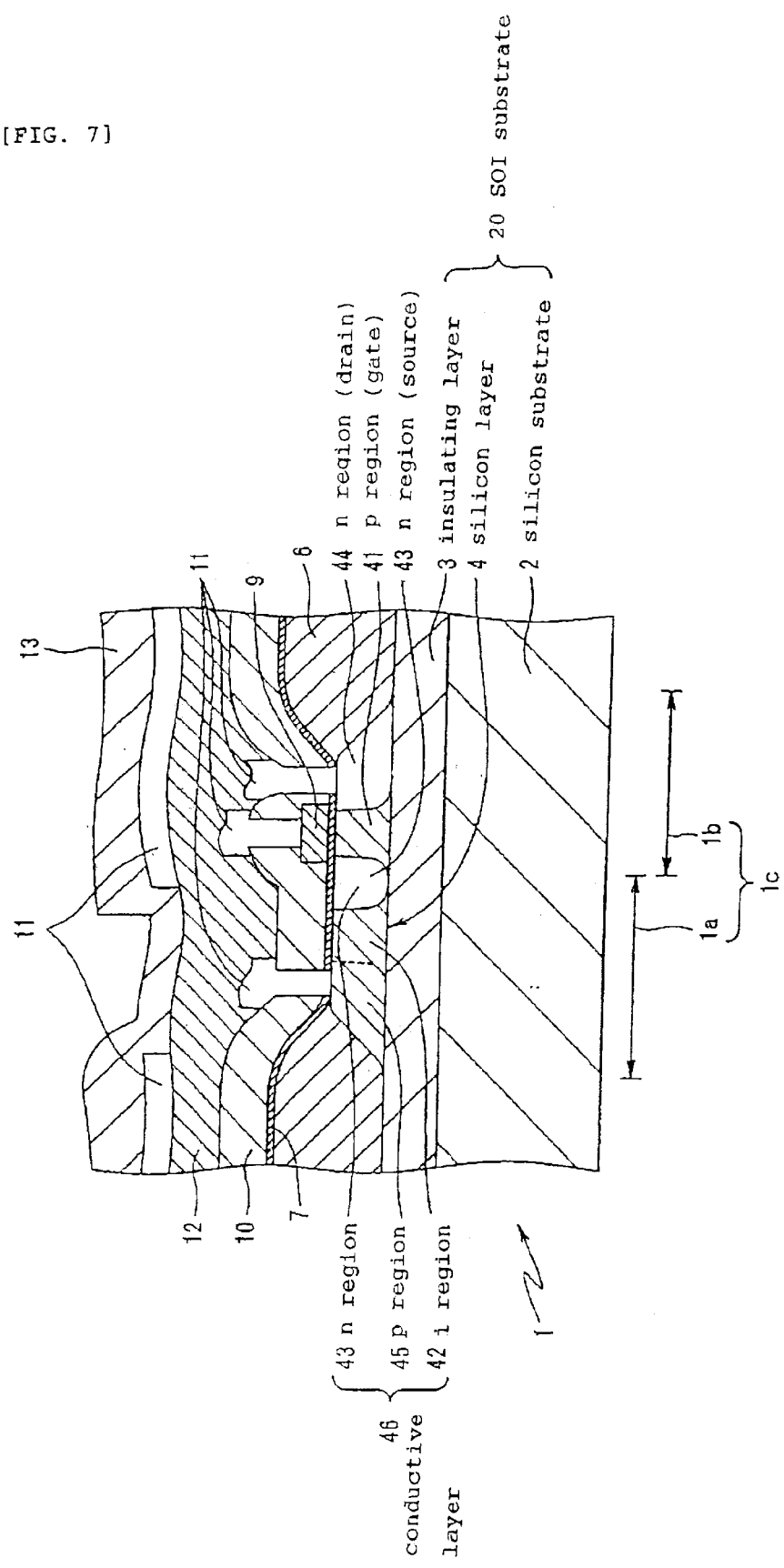

[FIG. 8]
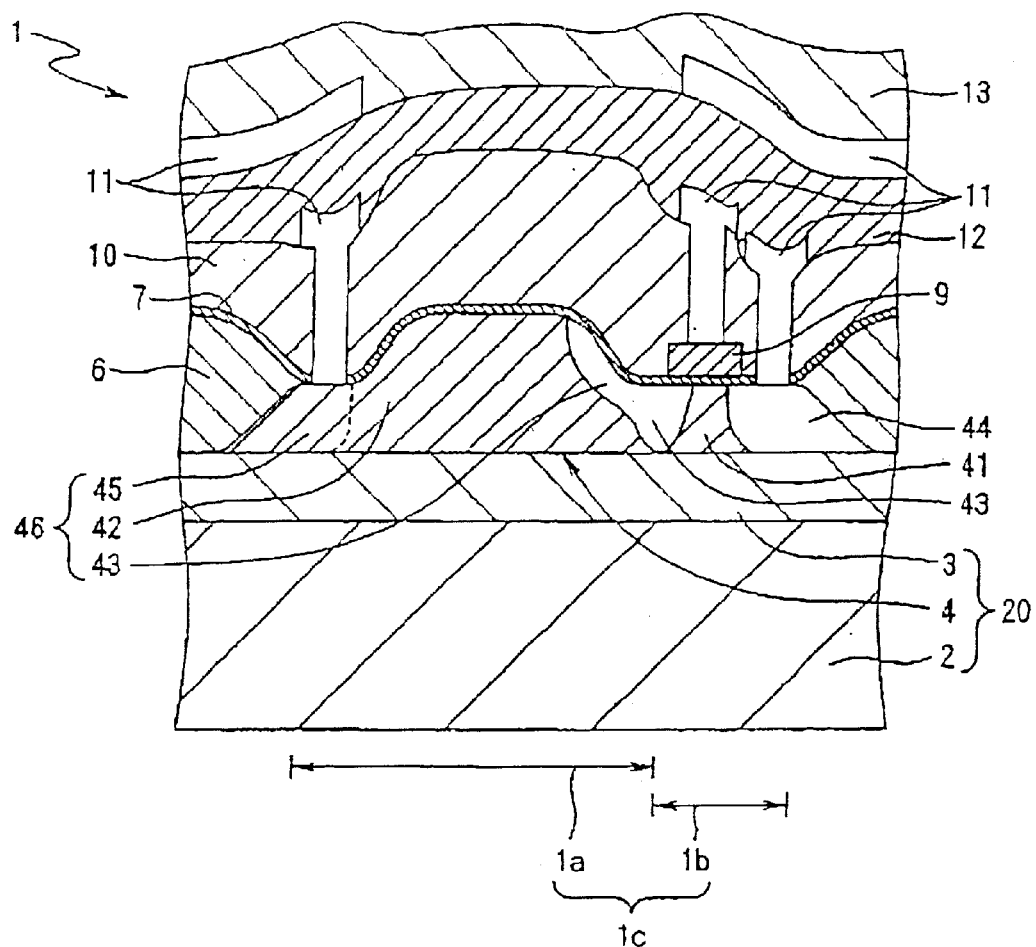

SEMICONDUCTOR DEVICE INCLUDING A PIN PHOTODIODE INTEGRATED WITH A MOS TRANSISTOR

FIELD OF THE INVENTION

The present invention relates to a semiconductor device and a production method thereof. The present invention particularly relates to an effective technology for forming, in a substrate in which a semiconductor layer is deposited on an insulating layer, an element in which a pin photodiode that converts light into a photocurrent and a MOS transistor through which the photocurrent is output are integrated. An exemplary substrate is an SOI substrate in which a silicon layer is deposited on an insulating layer.

DESCRIPTION OF THE RELATED ART

In semiconductor photodetectors that convert light into a photocurrent, commonly known as photodiodes, there is a problem in that an optical signal available for the photodiode has a low response frequency and is hard to detect.

In order to solve this problem, a pin photodiode in which the width of a depletion layer is enlarged by placing an i region (semiconductor layer) having a suitable thickness in a pn junction and by applying reverse bias has been proposed. The pin photodiode is composed of a conductive layer having a three-layer structure in which a p region is deposited on an i region which is deposited on an n region. When the i region receives light while a voltage is applied to the p region of the pin photodiode, the i region generates electron-hole pairs in response to the light intensity. The hole is transferred to the p region and the electron is transferred to the n region under the influence of the electric field of the depletion layer, so that a current is generated in the pin photodiode in the layered direction.

The proposed pin photodiode provides high photosensitivity and can be used at high frequencies, and providing the i region allows a reduction in dark current and noise to be achieved.

A semiconductor element in which the pin photodiode is integrated with a MOS transistor, through which a photocurrent is output, to efficiently output the photocurrent generated in the pin photodiode also has been proposed.

Since the pin photodiode is composed of the conductive layer having the three-layer structure in which the p region is deposited on the i region which is deposited on the n region, the perpendicular thickness of the conductive layer is at least 2 $\mu$m, and therefore, forming the pin photodiode in a substrate in which a thin semiconductor layer is deposited on an insulating layer is difficult. An exemplary substrate that may be used is an SOI substrate in which a thin silicon layer is deposited on an insulating layer.

Since an element in which a pin photodiode and a MOS transistor are integrated is directly formed in a so-called bulk silicon substrate, high-energy incident light penetrates deep into the silicon layer to generate electron-hole pairs. When the charge enters an adjacent gate, however, an accurate relationship between the incident light and an electrical signal is not realized.

Accordingly, the present invention provides a semiconductor device in which a pin photodiode and a MOS transistor are integrated on a SOI substrate and the like. The present invention has a high sensitivity and excellent electrical power saving. A production method and an electronic device are also provided.

SUMMARY OF THE INVENTION

The semiconductor device of the present invention includes an element in which a pin photodiode converts light into a photocurrent in response to a light intensity and a MOS transistor through which the photocurrent is output are integrated. The element is formed in a substrate including an insulating layer and a semiconductor layer. The semiconductor layer is deposited on the insulating layer. The pin photodiode has a p region, an i region, and an n region which are horizontally arranged in the semiconductor layer.

In the above semiconductor device, since the element in which the pin photodiode and the MOS transistor are integrated is formed in the substrate in which the semiconductor layer is deposited on the insulating layer, a substantial amount of junction leakage current flowing between electrodes is reduced. Furthermore, the high-energy incident light is transmitted through the semiconductor layer to generate electron-hole pairs in the insulating layer, and therefore, a charge entering a adjacent gate is reduced. Thus, the contrast of an input image is improved.

Since the conductive layer having the three-layer structure included in the pin photodiode is horizontally arranged in the semiconductor layer, the conductive layer can be formed on the substrate in which the semiconductor layer is deposited on the insulating layer. An exemplary substrate that may be used is an SOI substrate in which a silicon layer is deposited on an insulating layer.

In the semiconductor device of the present invention, the n region of the pin photodiode and a source of the MOS transistor may be the same.

Since the n region of the pin photodiode and the source of the MOS transistor may be the same, a photocurrent generated in the pin photodiode is transferred to the MOS transistor at a high speed, and therefore, the current is efficiently output.

In another aspect of the semiconductor device of the present invention, a region of the semiconductor layer including the pin photodiode has a larger thickness than that of another region of the semiconductor layer including the MOS transistor, and therefore, the semiconductor layer has an optimum thickness for both the pin photodiode and the MOS transistor. Thus, the efficiency of photoconversion in the pin photodiode and the high-speed performance in switching in the MOS transistor are both improved.

Another aspect of the invention is a method for producing the semiconductor device including the element in which the pin photodiode generating a photocurrent in response to light intensity and the MOS transistor through which the photocurrent is output are integrated. More particularly, the method includes a step (first ion-implantation step) of implanting ions in a state in which a resist pattern is formed to cover at least an area for forming the p region and the i region of the pin photodiode and to expose another area for forming the MOS transistor. An SOI substrate including an insulating layer and a silicon layer deposited on the insulating layer is used. Another step (second ion-implantation step) of implanting ions in a state in which a gate electrode material is deposited on a gate oxidation layer at a position corresponding to an area for forming the gate of the MOS transistor, and in which a resist pattern is formed to cover an area for forming the p region and the i region of the pin photodiode and to expose an area for forming the source and the drain of the MOS transistor and the n region of the pin photodiode is then performed. Finally, a step (third ion-implantation step) of implanting ions in the state in which a resist pattern is formed to cover an area for forming the n region and the i region of the pin photodiode and an area for forming the MOS transistor and to expose an area for forming the p region of the pin photodiode is performed.

Since the production method of the semiconductor device has the first ion-implantation step, the second ion-implantation step, and the third ion-implantation step, the lateral pin photodiode in which the conductive layer is horizontally arranged in the semiconductor layer is provided. Thus, the pin photodiode can be formed in a substrate in which a semiconductor layer is deposited on an insulating layer.

An electronic device of the present invention has the semiconductor devices arranged in a matrix pattern. Such a structure has microelements integrated on a plane and is suitable for detecting a two-dimensional image.

BRIEF DESCRIPTION OF THE DRAWINGS

FIG. 1 is a partly enlarged sectional view showing a step of a process for producing a semiconductor device according to an embodiment of the present invention.

FIG. 2 is a partly enlarged sectional view showing a step of a process for producing a semiconductor device according to an embodiment of the present invention.

FIG. 3 is a partly enlarged sectional view showing a step of a process for producing a semiconductor device according to an embodiment of the present invention.

FIG. 4 is a partly enlarged sectional view showing a step of a process for producing a semiconductor device according to an embodiment of the present invention.

FIG. 5 is a partly enlarged sectional view showing a step of a process for producing a semiconductor device according to an embodiment of the present invention.

FIG. 6 is a partly enlarged sectional view showing a step of a process for producing a semiconductor device according to an embodiment of the present invention.

FIG. 7 is a partly enlarged sectional view showing a step of a process for producing a semiconductor device according to an embodiment of the present invention.

FIG. 8 is a partly enlarged sectional view showing a semiconductor device according to another embodiment of the present invention.

DETAILED DESCRIPTION OF THE PREFERRED EMBODIMENTS

Embodiments of the present invention will now be described with reference to the drawings. FIGS. 1 to 7 are partly enlarged sectional views showing steps for producing a semiconductor device according to an embodiment of the present invention.

With reference to FIG. 7, a completed semiconductor device 1 according to an embodiment of the present invention will now be briefly described. The semiconductor device 1 includes an SOI substrate 20 in which an insulating layer 3 composed of a silicon oxide layer is deposited on a p-type silicon substrate 2 composed of a $p^-$ diffusion layer having an extremely low acceptor content. A silicon layer 4 is deposited on the insulating layer 3. The silicon layer 4, which is the top layer of the SOI substrate 20, is used for both a pin photodiode 1a and a MOS transistor 1b. Particularly, an n region 43 composed of an $n^+$ diffusion layer formed in the silicon layer 4 is used for both the pin photodiode 1a and a source of the MOS transistor 1b.

A p region 45 composed of a $p^+$ diffusion layer, an i region 42 composed of the $p^-$ diffusion layer, and the n region 43 composed of the $n^+$ diffusion layer, which are included in a conductive layer 46 having a three-layer structure and defining the pin photogate 1a, are horizontally arranged in the silicon layer 4. That is, the lateral pin photodiode 1a in which the conductive layer 46 having the three-layer structure is horizontally arranged is formed in the silicon layer 4.

The MOS transistor 1b has a pn junction formed in the silicon layer 4. A p region 41 composed of a $p^-$ diffusion layer functions as a gate, the n region 43 composed of the $n^+$ diffusion layer adjacent to the pin photodiode functions as a source, and another n region 44 functions as a drain.

A gate oxidation layer 7 composed of thin silicon oxide is disposed on the silicon layer 4 which is the top layer of the SOI substrate 20. A gate electrode 9 composed of polycrystalline silicon is disposed above the p region 41 which lies on the gate oxidation layer 7. The gate electrode 9 functions as the gate of the MOS transistor 1a. A first insulating layer 10 composed of silicon oxide is deposited over the gate electrode 9. Openings functioning as a contact connecting to the p region 45 of the pin photodiode 1a, the p region 41 functioning as the gate of the MOS transistor 1b, and an n region 44 functioning as the drain are provided in the first insulating layer 10. A metal wiring 11 composed of aluminum is deposited in the openings.

A second insulating layer 12 composed of silicon oxide is formed on the first insulating layer 10, and another metal wiring 11 is disposed on the second insulating layer 12. A passivation layer 13 composed of silicon nitride is disposed on the metal wiring 11.

Next, an exemplary method for producing the semiconductor device 1 will now be described.

As shown in FIG. 1, the insulating layer 3 composed of silicon oxide is deposited on the p-type silicon substrate 2 composed of the $p^-$ diffusion layer having an extremely low acceptor content. The silicon layer 4 having a thickness of about 1 μm is deposited on the insulating layer 3 to form the SOI substrate 20. In the above process, commercial SOI substrates may be used.

Depositing the silicon nitride layer which is resistant to oxidation and has a thickness of about 140 nm over the entire SOI substrate 20, patterning the silicon nitride layer to cover an element-forming region 1c with the silicon nitride layer 5, and then oxidation are performed.

As shown in FIG. 2, the region of the silicon layer 4 that is covered with the silicon nitride layer 5 is hardly oxidized because oxygen diffusion is inhibited at the region. A LOCOS oxide layer 6 composed of a thick silicon layer is formed at the exposed region of the silicon layer 4. The silicon nitride layer 5 is removed by wet etching, and the LOCOS oxide layer 6 composed of a thick silicon oxide layer 4 remains. The element-forming region 1c provided with the pin photodiode 1a and the MOS transistor 1b is separated from another element-forming region (not shown) by the LOCOS oxide layer 6.

As shown in FIG. 3, the thin gate oxidation layer 7 having a thickness of 8 nm is deposited to cover the element-forming region 1c shown in FIG. 2. A resist 8 formed on the gate oxidation layer 7 is patterned by a known photolithography technique so as to cover a region for forming the p region 45 and the i region 42 of the pin photodiode 1a so as to expose another region for forming the MOS transistor 1b. Boron ions are then implanted to form the p region 41 of the MOS transistor.

Because the boron ions are not implanted into at least the p region 45 and the i region 42 of the pin photodiode 1a covered with the resist 8, the region of the silicon layer 4 under the resist 8 is left as the p region composed of the p⁻⁻ diffusion layer.

The p region 41 composed of the p⁻ diffusion layer is formed at the exposed region of the silicon layer 4 in which the MOS transistor 1b is formed, and is used as an n channel layer under the gate of the MOS transistor 1b.

As shown in FIG. 4, the resist 8 shown in FIG. 3 is removed, and then an n-type polycrystalline silicon layer having a thickness of about 350 nm is deposited to cover the entire element-forming region 1c. Then, a resist pattern (not shown) is formed on the polycrystalline silicon layer at a region corresponding to another region for forming the gate of the MOS transistor 1b. In this state, by using the same method as shown in FIG. 3, the polycrystalline silicon layer is deposited at the region for forming the gate of the MOS transistor 1b to function as the gate electrode 9 of the MOS transistor 1b.

A resist 8 is patterned on the gate oxidation layer 7 formed as shown in FIG. 3 by the same method as shown in FIG. 3 so as to cover a region for forming the p region 45 and the i region 42 of the pin photodiode 1a so as to expose another region for forming the n region 43 of the pin photodiode 1a and the MOS transistor 1b. In this state, phosphorus ions are implanted to form the n region.

The n⁺ diffusion layers are formed at the gate electrode 9 and at the region of the silicon layer 4 that is not covered with the resist 8. The n region 43 adjacent to the pin photodiode functions as a source, the other n region 44 functions as a drain, and both n regions are connected to an output circuit. The n region 43, functioning as the source of the MOS transistor 1b, is also used as the n⁺ diffusion layer of the pin photodiode 1a.

Then, the residual resist 8 shown in FIG. 4 is removed. As shown in FIG. 5, another resist 8 is patterned by the same method as shown is FIG. 3 so as to cover the i region 42, the n region 43 which belongs to both the MOS transistor 1b, and the pin photodiode so as to expose the p region 45 of the pin photodiode 1a. In this state, boron ions are implanted to form a p region.

The p region 45 composed of the p⁺ diffusion layer is formed in the silicon layer 4 at the region for forming the pin photodiode 1a, wherein the region is not covered with the resist 8. The p region 45 is treated by rapid thermal annealing to recover the crystallinity which was degraded by the ion implantation in the SOI substrate 20 and to activate the boron ions, so that free electrons and holes function as carriers.

Up to the present process, the conductive layer 46 including the p region 45 composed of the p⁺ diffusion layer, the i region 42 composed of the p⁻ diffusion layer, and the n region 43 composed of the n⁺ diffusion layer, which are included in the pin photodiode 1a and are arranged in parallel in the silicon layer 4, are provided. Also, three electrodes consisting of a source composed of the n region 43, a drain composed of the n region 44, and a gate composed of the p region 41, which are included in the MOS transistor 1b, are provided.

As shown in FIG. 6, the first insulating layer 10 which is composed of silicon oxide and has a thickness of about 800 nm is deposited over the gate electrode 9 formed in the step described in FIG. 4. A resist (not shown) is patterned by the same method as shown in FIG. 3 so as to expose the region of the first insulating layer 10 corresponding to the p region 45 of the pin photodiode 1a, the gate electrode 9 of the MOS transistor 1b, and the n region 44 functioning as a drain. In this state, the region of the first insulating layer 10 corresponding to the p region 45 of the pin photodiode 1a, the gate electrode 9 of the MOS transistor 1b, and the n region 44 functioning as a drain are removed by dry etching. Then, the residual resist is removed and the metal wiring 11 composed of aluminum is deposited at the contact opening.

As shown in FIG. 7, the second insulating layer 12 which is composed of silicon oxide and has the same thickness as that of the first insulating layer 10 is deposited on the first insulating layer 10. An aluminum layer for the metal wiring 11 is deposited on the second insulating layer 12, and then the deposited aluminum layer is etched to form wiring. The passivation layer 13 which is composed of silicon nitride and has a thickness of 500 nm is deposited on the second insulating layer 12 in order to protect the second insulating layer 12 composed of silicon oxide. Thus, the semiconductor device 1, in which an element which is composed of the pin photodiode 1a and the MOS transistor 1b which are integrated is formed on the SOI substrate 20, is completed.

When the i layer 42 receives light while a voltage is applied to the p region 45 of the pin photodiode 1a, the semiconductor device 1 generates a photocurrent in response to the light intensity. Applying a voltage to the gate electrode 9 of the MOS transistor 1b causes the n region 43 functioning as a source to receive the photocurrent generated in the pin photodiode 1a and causes the n region 44 functioning as a drain to output the photocurrent.

Since the pin photodiode 1a has a structure in which the p region 45, the i region 42, and the n region 43 are horizontally arranged relative to the silicon layer 4, the semiconductor device 1 can be formed in the silicon layer 4 having a thickness of about 1 μm. Thus, an element having the pin photodiode 1a including the conductive layer 46 having the three-layer structure can be formed in the SOI substrate 20.

Since a junction leakage current generated in a bulk silicon substrate having a semiconductor element is reduced, the S/N ratio and the dynamic range increases, and therefore, the noise decreases. Also, elements can be formed close to each other, which is effective in integrating semiconductor elements.

Even high-energy incident light is transmitted through the silicon layer 4 to generate electron-hole pairs in the insulating layer 3, and therefore, charge transfer into the adjacent element is suppressed. Thus, the accurate relationship between the incident light and the electrical signal is realized.

The n region 43 composed of the n⁺ diffusion layer is used for both the pin photodiode 1a and the source of the MOS transistor, and therefore, a photocurrent generated in the pin photodiode 1a is transferred to the source of the MOS transistor 1b at a high speed. Thus, current is efficiently output.

Elements in which a pin photodiode and a MOS transistor are integrated are arranged in the form of a matrix, and therefore, microelements can be integrated on a plane. Thus, a two-dimensional optical image can be detected. Moreover, the image quality in electronic devices such as copy machines and scanners is improved.

Apart from the light-detecting device described above, the semiconductor device 1 according to the present invention can also be used as a device for converting light energy into electrical energy, for example, a solar cell.

Furthermore, as shown in FIG. 8, it is effective that a pin photodiode 1a is composed of a thick silicon layer 4 and a MOS transistor 1b is composed of a thin silicon layer 4. FIG. 8 is a partly enlarged plan view showing a semiconductor device 1 according to another embodiment of the present invention.

In such a structure, an i region 42 generating a photocurrent in a pin photodiode 1a has a large thickness, and therefore, the photocurrent increases. Since a MOS transistor 1b is composed of a thin silicon layer 4, the switching is fast, and therefore, the pin photodiode 1a and the MOS transistor 1b have high functional efficiency. Accordingly, it is effective to form the semiconductor device 1 provided with the pin photodiode 1a having an improved photoconversion efficiency and the MOS transistor 1b having high-speed switching.

When a contact opening connecting to the pin photodiode 1a is not provided at the top of the pin photodiode 1a but is provided at the end thereof, providing the contact opening connecting to the pin photodiode 1a and etching are performed in the same step as that of the contact opening to the MOS transistor 1b, and therefore, the production efficiency is improved.

Silicon oxide is used for the insulating layers 3, 10, and 12, the silicon nitride layer 5 is used as a layer resistant to oxidation, Al is used for the metal wiring 11, polycrystalline silicon layer is used for the gate electrode 9, and silicon nitride is used for the passivation layer 13. Materials other than those of the embodiments may be used as long as the materials have the same functions as those of the materials used in the embodiments. Also, the thicknesses thereof are not limited to those of the embodiments.

Although boron ions are used for the p regions 41 and 45 in the embodiments, Al or Ga may be used instead. Although phosphorus ions are used for the n regions 43 and 44, As or Sb may be used instead.

Although the pin photodiode 1a and the n-type MOS transistor 1b both using the same n region 43 are formed in the embodiments, a p-type MOS transistor may be used when the arrangement in the pin photodiode 1a is in the reverse order. The same effect is achieved in both cases.

The semiconductor device 1 according to the present invention may be formed by forming an element in a substrate in which a semiconductor layer is deposited on an insulating layer 3 or forming an element in a semiconductor layer deposited on another substrate and then peeling the semiconductor layer from the substrate to paste it onto an insulating layer 3.

Although the SOI substrate 20 in which the silicon layer 4 is deposited on the insulating layer 3 is used in the embodiments, other semiconductors may be deposited on the insulating layer 3 other than the silicon layer 4. Furthermore, although the insulating layer 3 composed of silicon oxide is used as an insulator, other insulators such as sapphire may be used instead.

As described above, in the semiconductor device of the present invention, a substantial amount of junction leakage current flowing between elements is reduced because an element in which a pin photodiode and a MOS transistor are integrated is formed in a substrate in which a semiconductor layer is deposited on an insulating layer. Also, high-energy incident light generates electron-hole pairs in the insulating layer through the semiconductor layer, and therefore, the structure is suitable to suppress charge transfer to an adjacent gate.

A semiconductor device having semiconductor elements effectively integrated, high sensitivity, and excellent electrical power saving is provided.

The structure in which the p region, the i region, and the n region of the pin photodiode are horizontally arranged in the semiconductor layer provides a substrate in which the semiconductor layer is deposited on the insulating layer, wherein an exemplary substrate is an SOI substrate.

Since the n region of the pin photodiode and the source of the MOS transistor are the same, the photocurrent is efficiently transferred, and therefore, the semiconductor device has high-speed performance in operation and excellent electrical power saving.

In the above semiconductor device, the region of a semiconductor layer including the pin photodiode has a larger thickness than that of another region of the semiconductor layer including the MOS transistor, and therefore, the semiconductor layer has the optimum thicknesses in the use of the pin photodiode and the MOS transistor.

Thus, a semiconductor device in which the efficiency of light conversion in the pin photodiode and the high-speed switching performance in the MOS transistor are both improved is provided.

Since the production method of the semiconductor device according to the present invention has the first ion-implantation step, the second ion-implantation step, and the third ion-implantation step, a lateral pin photodiode in which the conductive layer is horizontally arranged in the semiconductor layer is provided.

Thus, an element in which the pin photodiode and the MOS transistor are integrated can be formed in the substrate in which the semiconductor layer is deposited on the insulating layer, wherein an exemplary substrate is an SOI substrate in which a silicon layer is deposited on an insulating layer.

The electronic device of the present invention has the above semiconductor devices arranged in a matrix pattern. Such a structure has microelements integrated on a plane and is suitable for detecting a two-dimensional image. Thus, the image quality of electronic devices such as copy machines and scanners is improved.

What is claimed is:

1. A semiconductor device comprising an element in which a pin photodiode generating a photocurrent in response to light intensity and a MOS transistor through which the photocurrent is output are integrated;

wherein the element is formed in a substrate comprising an insulating layer and a semiconductor layer deposited on the insulating layer;

wherein the pin photodiode has a p region, an i region, and an n region which are horizontally arranged in the semiconductor layer; and wherein said MOS transistor includes a pn junction formed in said silicon layer.

2. A semiconductor device according to claim 1, wherein the n region of the pin photodiode and the source of the MOS transistor are the same.

3. A semiconductor device according to claim 1, wherein the substrate is an SOI substrate in which a silicon layer is deposited on the insulating layer.

4. A semiconductor device according to claim 1, wherein the semiconductor layer including the pin photodiode has a larger thickness than that of the semiconductor layer including the MOS transistor.

5. An electronic apparatus having a structure in which semiconductor devices according to claim 1 are arranged in a matrix pattern.

6. A semiconductor device comprising:

a SOI substrate including a silicon substrate, an insulating layer disposed on said silicon substrate, and a silicon layer disposed on said insulating layer; and an element including a pin photodiode and a MOS transistor, said element is formed in said silicon layer, wherein said photodiode includes a p region, an i region, and an n region, said p region, said i region, and said n region are horizontally arranged in said silicon layer; and said MOS transistor includes a pn junction formed in said silicon layer.

7. The semiconductor device according to claim 6, wherein said n region of said photodiode and a source of said MOS transistor are the same.

8. The semiconductor device according to claim 6, wherein a region of said silicon layer including said pin photodiode has a larger thickness than that of another region of said silicon layer including the MOS transistor.

* * * * *